(12) United States Patent
Desai

(10) Patent No.: US 7,873,132 B2
(45) Date of Patent: Jan. 18, 2011

(54) CLOCK RECOVERY

(75) Inventor: Jayen Desai, Wellington, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 1406 days.

(21) Appl. No.: 11/232,154

(22) Filed: Sep. 21, 2005

(65) Prior Publication Data

US 2007/0064848 A1    Mar. 22, 2007

(51) Int. Cl.
*H03D 3/24* (2006.01)

(52) U.S. Cl. .................. 375/376; 375/371; 375/373; 375/354; 375/355

(58) Field of Classification Search ............. 375/376, 375/373, 371, 354, 355; 370/504; 714/12
See application file for complete search history.

(56) References Cited

U.S. PATENT DOCUMENTS

| | | | |
|---|---|---|---|
| 4,926,447 A | 5/1990 | Corsetto et al. | |
| 4,992,790 A * | 2/1991 | Montgomery | 341/70 |
| 5,559,841 A * | 9/1996 | Pandula | 375/375 |
| 6,021,503 A * | 2/2000 | Pax et al. | 713/400 |
| 6,316,966 B1 | 11/2001 | Chang et al. | |
| 6,347,128 B1 | 2/2002 | Ransijn | |
| 6,526,109 B1 | 2/2003 | Chang et al. | |
| 6,538,475 B1 * | 3/2003 | Johansen et al. | 327/12 |
| 6,614,314 B2 | 9/2003 | d'Haene et al. | |
| 6,614,842 B1 * | 9/2003 | Chou et al. | 375/232 |
| 6,686,777 B1 | 2/2004 | Karlquist | |
| 6,791,420 B2 | 9/2004 | Unterricker | |
| 7,049,869 B2 * | 5/2006 | d'Haene et al. | 327/165 |
| 7,065,160 B2 * | 6/2006 | Berger et al. | 375/340 |
| 7,142,623 B2 * | 11/2006 | Sorna | 375/376 |
| 7,149,269 B2 * | 12/2006 | Cranford, Jr. et al. | 375/373 |
| 7,376,211 B2 * | 5/2008 | Payne et al. | 375/354 |
| 7,386,405 B2 * | 6/2008 | Waschura et al. | 702/65 |
| 2002/0110215 A1 * | 8/2002 | Hendrickson | 375/376 |
| 2002/0131539 A1 * | 9/2002 | Li et al. | 375/355 |
| 2003/0133467 A1 | 7/2003 | Navarro et al. | |
| 2004/0170244 A1 | 9/2004 | Cranford, Jr. et al. | |
| 2006/0023822 A1 * | 2/2006 | Castle | 375/360 |
| 2008/0152057 A1 * | 6/2008 | Lee et al. | 375/355 |

OTHER PUBLICATIONS

Electronics Letter, J.D.H. Alexander, "Clock Recovery from Random Binary Signals", vol. 11, pp. 541-542, Oct. 1975.
IEEE Journal of Solid-State Circuits, K.K. Chang, "A 0.4-4-Gb/s CMOS Quad Transceiver Cell Using On-ChipRegulated Dual-Loop PLLs", vol. 28, No. 5, pp. 747-754, May 2003.

* cited by examiner

*Primary Examiner*—Shuwang Liu
*Assistant Examiner*—Helene Tayong

(57) ABSTRACT

A method and apparatus of recovering a clock signal from an input data signal consistent with certain embodiments, where the clock signal has a clock cycle equal to one data bit period, involves identifying an earliest transition time position in a sequence of data signal transitions; identifying a latest transition time position in the sequence of data signal transitions; calculating an approximate average transition time of the sequence of clock transitions; calculating a sampling time for sampling data in the input data signal as the approximate average transition time plus one half clock cycle; and adjusting a sampling clock time to approximate the sampling time. This abstract is not to be considered limiting, since other embodiments may deviate from the features described in this abstract.

25 Claims, 7 Drawing Sheets

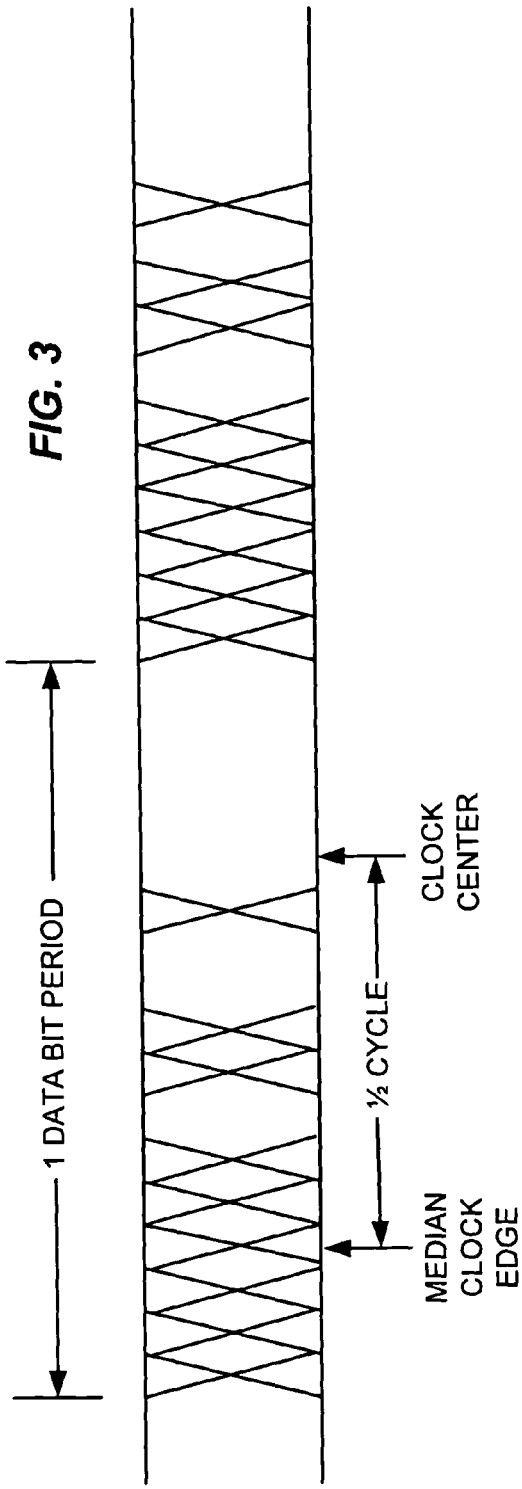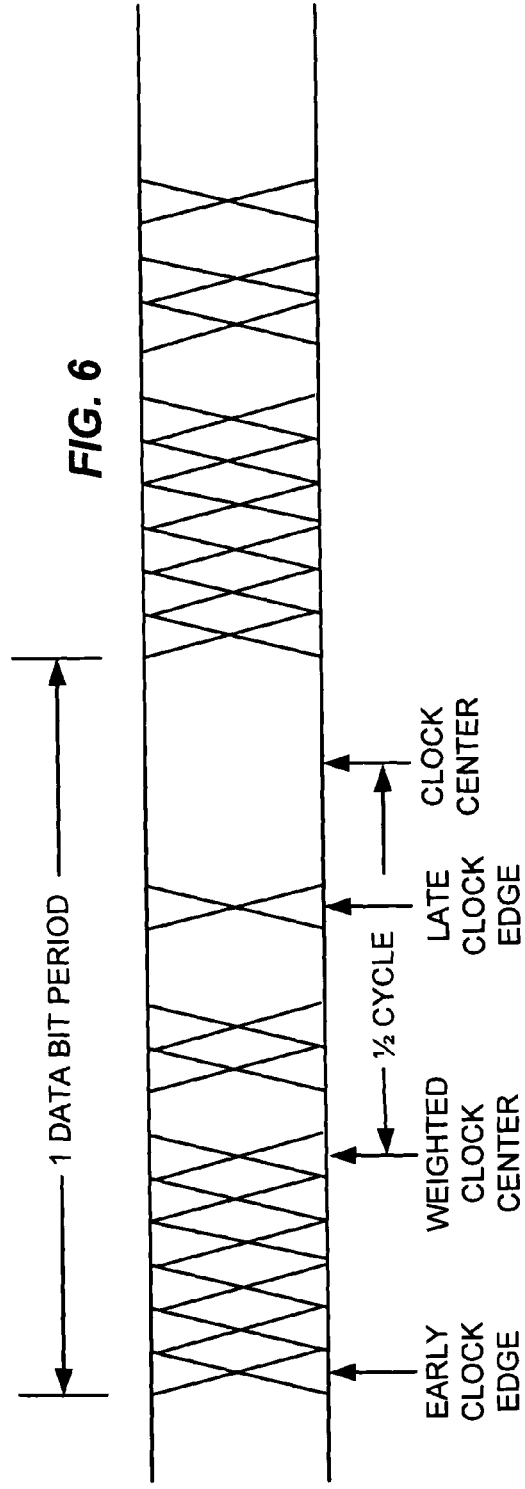

CLOCK RECOVERY

BACKGROUND

Current clock recovery structures for high speed links use a minimum likelihood method for optimizing the sampling of incoming data. Such clock recovery structures are described in *Electronic Letters*, J. D. H. Alexander, "Clock Recovery from Random Binary Signals," vol. 11, pp. 541-542, October 1975, which is hereby incorporated by reference. The type of phase detector and clock recovery circuit described by Alexander is widely used. As long as the jitter on the input data has a symmetric probability distribution, the technique and circuitry described by Alexander works well.

FIG. 1 illustrates one embodiment of a clock recovery circuit 50 consistent with Alexander's teachings, with modifications on the input for receipt of a differential input signal. Clock recovery circuits such as circuit 50 are used in a receiver device to determine the optimal time to sample differential input data at 52 and 54 in order to avoid sampling data during data transitions. This circuitry is used because the receiving device has no knowledge of the relative delay between its clock input and the data from the transmitting device. Circuit 50 uses a separate master clock 58 whose frequency is similar or identical to the clock used to clock the transmitted data. A feedback loop makes adjustments to the clock so that the receiving circuitry functions correctly.

The input data at 52 and 54 are shown as differential (as most high speed links are). The data are processed by a pair of limiters 60 and 62 to reshape the data. The data are then sampled by two latches 64 and 66, whose clocks are ck_edge and ck_center. Ck_edge and ck_center are generated by two delay interpolators shown together as 70. These delay interpolators move the location of the ck_edge and ck_center clocks based on the value of their respective delay_codes (delay_code_edge 72 and delay_code_center 74) which are output from filter 76. The interpolators allow an all-digital implementation of the clock recovery loop because the digital codes change the delay of the output clocks in fine increments.

The logic in the feedback loop is designed to change delay_code_edge 72 so that ck_edge is aligned with a most likely data transition time (i.e., the worst time to try and sample correct data). Ck_center is created by digitally manipulating delay_code_center 74 as a function of delay_code edge 72 so that ck_center is one half of a data bit period (half of the clock cycle) away from ck_edge. This placement of ck_center is near optimal if the placement of ck_edge corresponds to the center of symmetrical jitter in the input data eye diagram. The Alexander reference describes one embodiment of the logic functions used in the early/late logic 80. This logic determines whether ck_edge and ck_center are early, late or neither. The filter 78 then produces signals 72 and 74 which adjust ck_edge and ck_center. These signals 72 and 74 are used to place the location of the ck_edge transitions at approximately the median (half the transitions earlier, half the transitions later) of the transitions and place the clock center (ck_center) one half clock cycle away. The details for carrying out this operation are discussed in Alexander's paper and need not be repeated here.

BRIEF DESCRIPTION OF THE DRAWINGS

Certain illustrative embodiments illustrating organization and method of operation, together with objects and advantages may be best understood by reference detailed description that follows taken in conjunction with the accompanying drawings in which:

FIG. 3 is a second data eye pattern having asymmetric transitions.

FIG. 6 is a third data eye pattern having asymmetric transitions.

DETAILED DESCRIPTION

Figure 1:
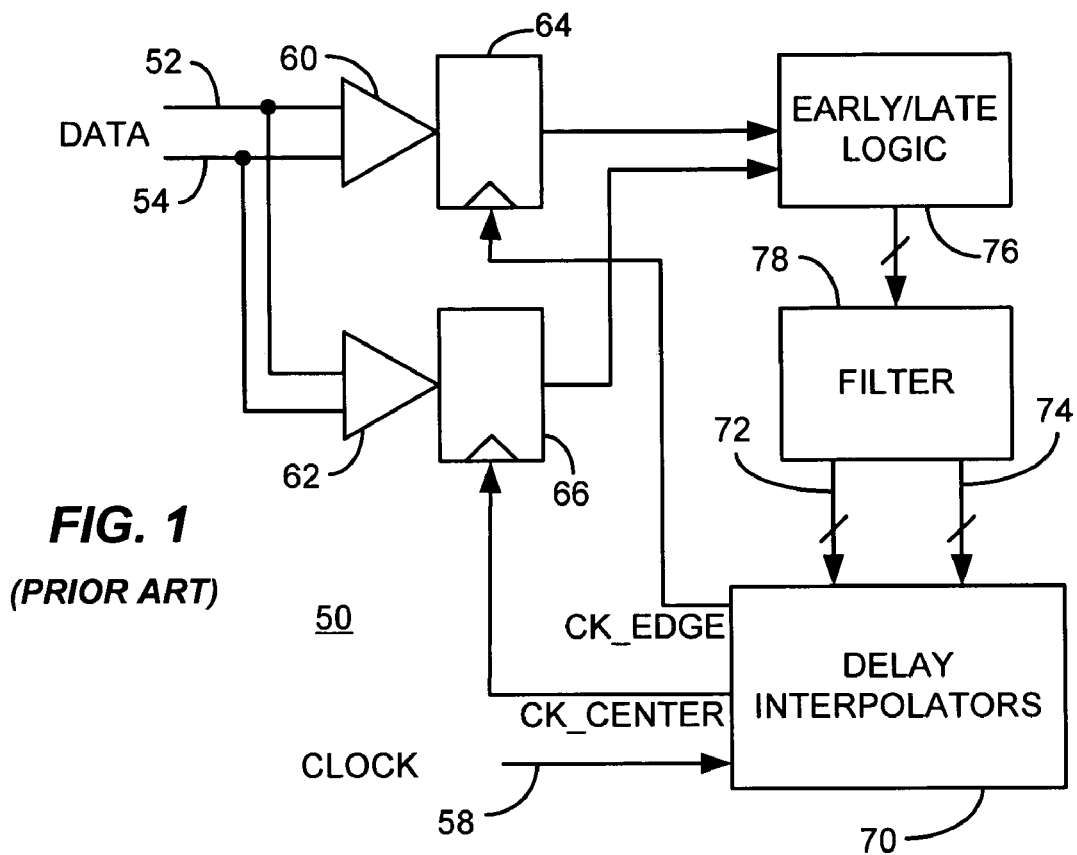
FIG. 1 is a circuit diagram of Alexander's clock recovery circuit as used for differential data.

While this invention is susceptible of embodiment in many different forms, there is shown in the drawings and will herein be described in detail specific embodiments, with the understanding that the present disclosure of such embodiments is to be considered as an example of the principles and not intended to limit the invention to the specific embodiments shown and described. In the description below, like reference numerals are used to describe the same, similar or corresponding parts in the several views of the drawings.

The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically. The term "program", as used herein, is defined as a sequence of instructions designed for execution on a computer system. A "program", or "computer program", may include a subroutine, a function, a procedure, an object method, an object implementation, in an executable application, an applet, a servlet, a source code, an object code, a shared library/dynamic load library and/or other sequence of instructions designed for execution on a computer system.

Reference throughout this document to "one embodiment", "certain embodiments", "an embodiment" or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

Figure 2:
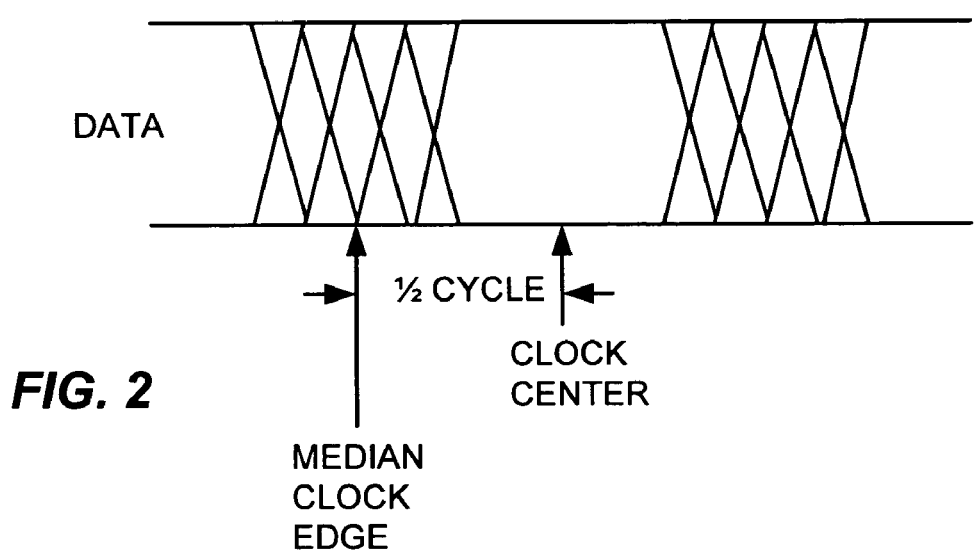
FIG. 2 is a first data eye pattern having symmetric transitions.

When Alexander's circuit 50 is used to recover clock signals from data having a well defined symmetrical eye pattern as shown in FIG. 2, the circuit 50 essentially calculates the median clock edge position (half of the transitions above and half of the transitions below) as shown and places the clock center one half clock cycle away. As seen, this clock center placement is a good placement for sampling the data for this example. However, when the eye pattern is asymmetrical, this circuit fails to function optimally, and may produce data errors. Asymmetric jitter patterns can occur because of severe intersymbol interference on the channel, sever clock jitter, noise or other factors.

Consider the input data eye pattern shown in FIG. 3. In this example, consider what happens if circuit 50 is used to identify the median clock edge approximately as shown, and spaces the clock center one half clock period (equals one data bit period) away as shown. Note that this placement is dangerously close to some of the asymmetric data transitions. As a result, the center clock placement could result in data errors by virtue of sampling the input data during a transition, should the jitter get only slightly worse or experience even a small transient phenomenon. Hence, this technique suffers from non-optimal data sampling times when the jitter on the input data has an asymmetric probability distribution.

As explained above, FIG. 3 illustrates one problem that occurs with circuit 50 when the input data jitter is asymmetric. In this case, the Alexander algorithm will align ck_edge to approximate the median of the jitter transitions. This happens because Alexander's early/late phase detection in the feedback loop imposes equal penalties in the clock correction regardless of the location of the transition. In this case, one can see that shifting ck_center one half bit period away from ck_edge (the median clock edge) results in a non-optimal placement of ck_center. Further jitter will likely result in data errors due to sampling a data signal at a transition.

In certain embodiments consistent with the present invention, three times oversampling is used to address the problems of clock recovery in data having an asymmetrical data eye patterns while maintaining an all digital control loop.

Figure 4:
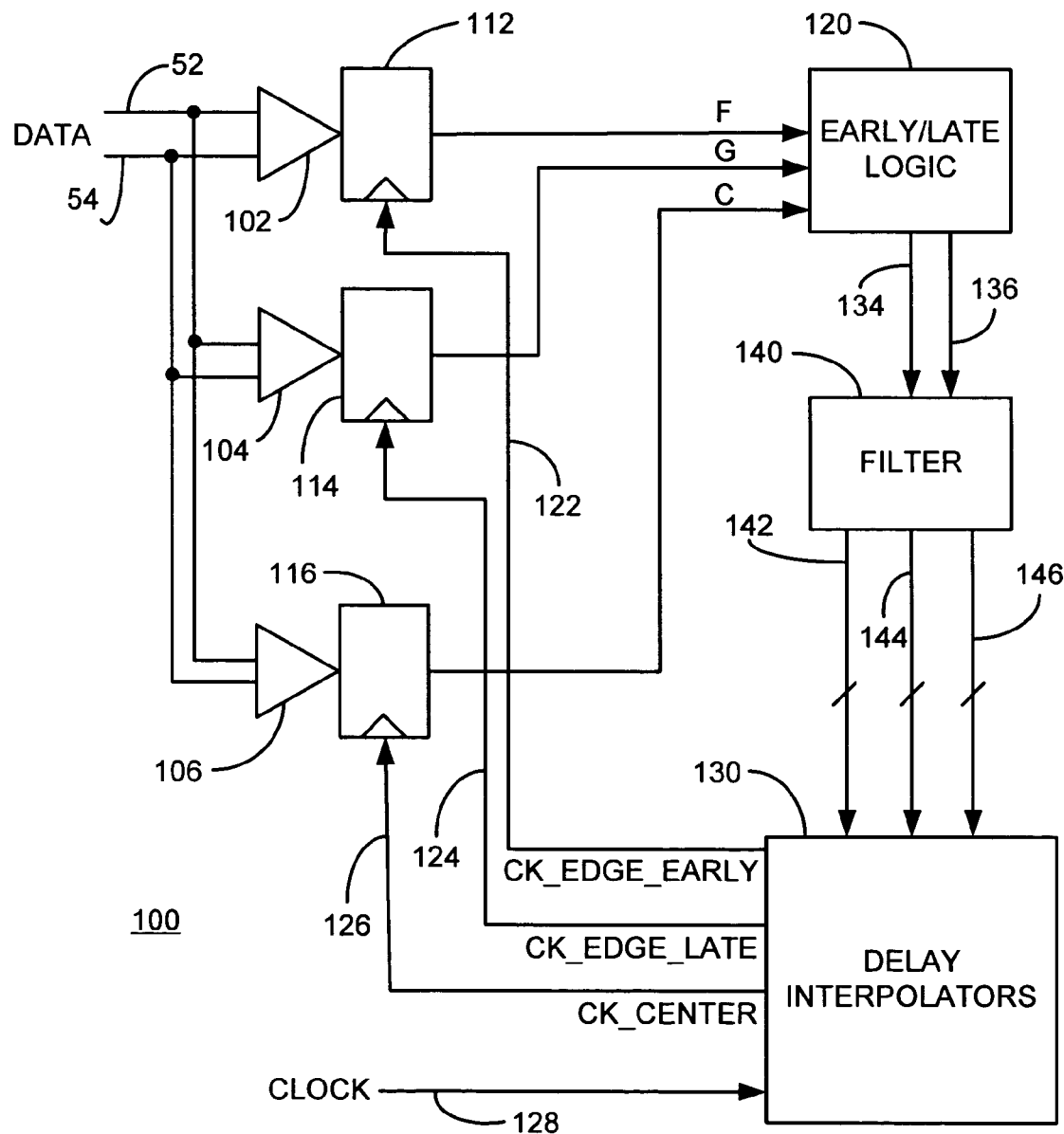
FIG. 4 is a circuit diagram of a clock recovery circuit consistent with certain embodiments.

The algorithm used in Alexander's clock recovery system essentially finds a median value of the clock transitions. This is done by producing a pulse representing a "vote" for either early or late for each transition for which a determination can be made. This vote based on the early/late samples is used in the filter 78 to incrementally move the delay_code outputs after a threshold of early or late votes has been reached from the early/late logic 76. Certain embodiments consistent with the present invention use three times oversampling in conjunction with a more sophisticated filtering arrangement than that used by Alexander. FIG. 4 depicts a circuit used in one embodiment.

In FIG. 4, differential input data at 52 and 54 are applied to limiters 102, 104 and 106 may be either separate limiters or may share transistors with latching devices such as D-flip flops 112, 114 and 116. In practice for high speed circuits, the same transistors can be used to fabricate both the latches and the limiters, so that a separate limiter is used for each input latch to facilitate operation at high data rates. This is represented in FIG. 4 by the legends used for the latches and the limiters. (Note that the Alexander reference uses a single limiter shown as a separate device from the latches (D-flip flops)).

In certain embodiments, a single limiter may equivalently be shared by all three latching devices 112, 114 and 116. The output of latching devices 112, 114 and 116 produce signals F, G and C respectively as shown which provide inputs to the early/late logic 120, the operation of which will be described in greater detail later. Input data at 52 and 54 are clocked into latch 112 at a time determined by ck_edge_early signal 122 (the early clock, or early clock edge). Input data at 52 and 54 are similarly clocked into latch 114 at a time determined by ck_edge_late signal 122 (the late clock or late clock edge). Input data at 52 and 54 are also similarly clocked into latch 116 at a time determined by ck_edge_center signal 126 (the center clock, or center clock edge or sampling clock). Each of these clock signals 122, 124 and 126 are derived from clock 128 by delay interpolator 130 on the basis of clock control signals (delay codes) from filter 140.

The early late logic produces output signals 134 and 136 to filter 140 according to logical conclusions drawn from comparing the received data signal at 52 and 54 with clock signals 122, 124 and 126. Although not shown explicitly in circuit 100, clock signal ck_center 126 is also supplied to early/late logic 120. These output signals 134 and 136 are votes that are filtered by filter 140 to produce clock control signals (delay codes) 142, 144 and 146. These delay codes are then used by delay interpolators 130 to adjust the timing of clock signals 122, 124 and 126. This can be accomplished by using the delay codes to establish a specified delay from the reference clock signal to generate clocks 122, 124 and 126.

Figure 5:
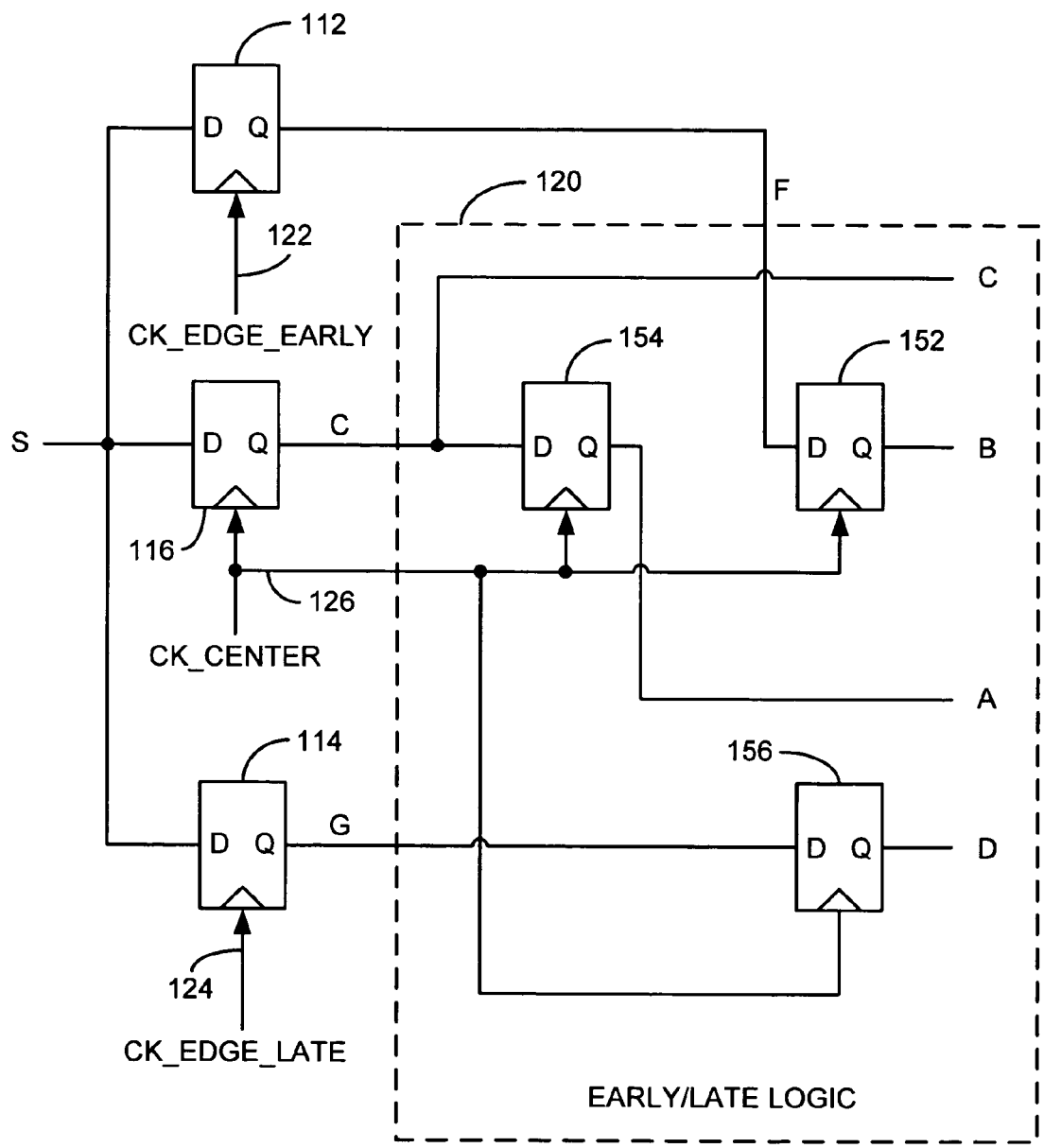
FIG. 5 is circuit diagram illustrating a portion of the early/late logic 120 consistent with certain embodiments.

FIG. 5 depicts the early stages of early late logic 120 in combination with the latches 112, 114 and 116 of circuit 100 to illustrate generation of the logic signals used to generate the outputs 134 and 136 of circuit 100. Each of the latching devices can be implemented using a D flip flop in certain non-limiting embodiments. The limiters have been omitted from this figure for clarity, but could be considered to be a part of the D flip flops shown, or could be considered to be the source of signal S (or three parallel and identical signals S). Output signal F from latching device 112 is clocked into latching device 152 by clock signal ck_center 126. The output of latching device 152 produces a signal B. In a similar manner, signal C from latching device 116 is clocked into latching device 154 by clock signal ck_center 126. The output of latching device 154 produces a signal A. Additionally, signal G from latching device 114 is clocked into latching device 156 by clock signal ck_center 126. The output of latching device 156 produces a signal D. The output signals A, B, C and D are applied to combinational logic or a suitable processor to apply logic according to the following logic tables TABLE 1 and TABLE 2. These logic tables each follow logic similar to that used by Alexander, except that one table is used to evaluate early clock transitions and one is used to evaluate the late clock transitions, whereas Alexander's table determined the median of all clock transitions.

TABLE 1

| A | B | C | Conclusion |
| --- | --- | --- | --- |
| 0 | 0 | 0 | X |
| 0 | 0 | 1 | LE |
| 0 | 1 | 0 | X |
| 0 | 1 | 1 | EE |
| 1 | 0 | 0 | EE |
| 1 | 0 | 1 | X |
| 1 | 1 | 0 | LE |
| 1 | 1 | 1 | X |

TABLE 2

| 0 | 0 | 0 | X |
| --- | --- | --- | --- |
| 0 | 0 | 1 | LL |
| 0 | 1 | 0 | X |
| 0 | 1 | 1 | EL |
| 1 | 0 | 0 | EL |
| 1 | 0 | 1 | X |
| 1 | 1 | 0 | LL |
| 1 | 1 | 1 | X |

The logic associated with TABLE 1 produces outputs which are either LE for a determination that a data signal edge is late with respect to the early clock (ck_edge_early), EE for a determination that a data signal is early with respect to the early clock (ck_edge_early) or X which indicates an indeterminate condition.

Similarly, the logic associated with TABLE 2 produces outputs which are either LL for a determination that a data signal edge is late with respect to the late clock (ck_edge_late), EL for a determination that a data signal is early with respect to the late clock (ck_edge_late) or X which indicates an indeterminate condition.

The signals ck_edge_early is a clock signal that makes a transition at approximately a point in the clock cycle where the earliest of data transitions appears to be occurring. The ck_edge_late signal is a clock signal that makes a transition at approximately a point in the clock cycle where the latest of data transitions appears to be occurring. The logic of TABLE 1 and TABLE 2, measures these clock signals to provide an indication of whether the early and late clocks should be adjusted forward or backward to provide an appropriate location for the respective clock transitions in the clock cycles. This information is used by a pair of filters, such as asymmetric filters, in filter 140. These two filters are used to control ck_edge_early (using delay_code_early signal 142) and ck_edge_late (using delay_code_late signal 144). The ck_center signal is adjusted using delay_code_center signal 146 to transition at a point located one half clock cycle from the mid point between ck_edge_early and ck_edge_late).

The logic of TABLE 1 determines if the ck_edge_early signal should be adjusted to make an earlier or later transition. The conclusions produced from TABLE 1 are applied to a first asymmetric filtering function of filter 140 to produce delay codes 142 which control the ck_edge_early timing. Each output of EE or LE can be considered to be a vote for early or late adjustment of the timing of ck_edge_early, which is accumulated in the filter. Since ck_edge_early represents the earliest possible transition time, filter 140 is biased to weigh late votes more strongly than early votes. This forces ck_edge_early to track early edge of the jitter window. Any or all of several mechanisms can be used to accomplish this bias toward late votes.

The logic of TABLE 2 determines if the ck_edge_late signal should be adjusted to make an earlier or later transition. A second asymmetric filter of filter 140 processes the information from TABLE 2. Each output of EL or LL can be considered to be a vote for early or late adjustment of the timing of ck_edge_late which is accumulated. This second asymmetric filter weighs early votes more heavily than late votes. This forces ck_edge_late to track the late edge of the jitter window. Any or all of several mechanisms can be used to accomplish this bias toward early votes.

The relative strengths of the weightings used in the asymmetric filters of filter 140 can be controlled digitally to allow testing, characterization, and debugging in a variety of jitter environments in order to optimize the weightings or can be fixed for a generalized set of conditions. The net result is depicted in FIG. 6 in which the early clock edge ck_edge_early transition approximates the earliest transition of the jitter window. Similarly, the late clock edge ck_edge_late transition indicates the position of the latest transition in the jitter window. These times are used to generate a center clock point. The clock center clock ck_center transition can then be spaced one half clock cycle from the clock center to produce a point in the clock cycle for sampling data that is spaced approximately half way between the latest data transition and the earliest data transition, and thus, farther away from the clock transitions to enhance immunity to jitter in situations of asymmetric jitter.

Figure 7:
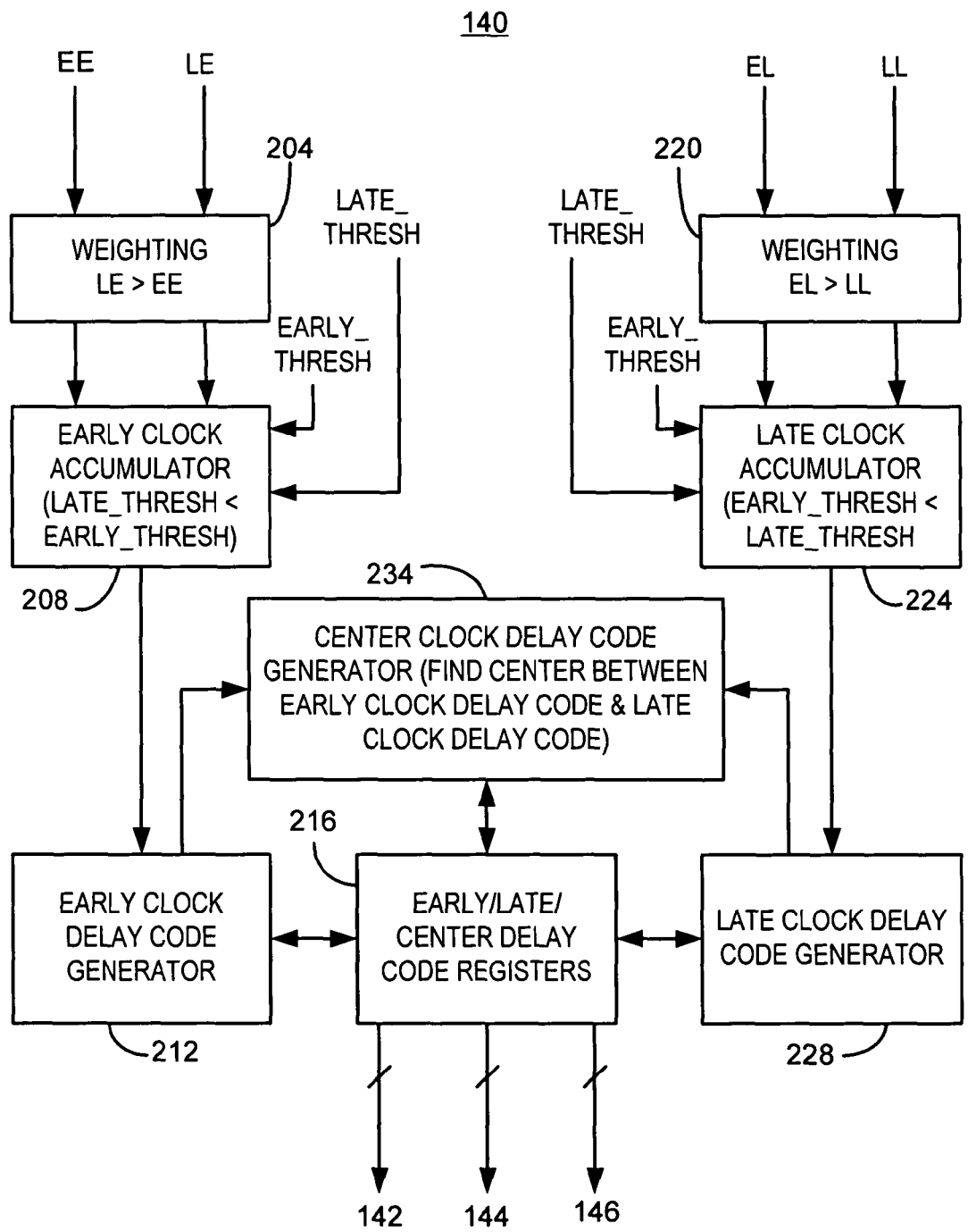
FIG. 7 is a circuit block diagram of filter 140 consistent with certain embodiments.

Turning now to FIG. 7, a functional block diagram of filter 140 is shown. The output values of the logic that implements TABLE 1 and TABLE 2 are applied as inputs EE, LE, EL and LL to the filter 140. The adjustment of the early clock delay codes depends upon inputs EE and LE which are conceptually illustrated as being weighted by a weighting process 204 so that LE input signals are weighted more heavily than EE input signals. Once the values of EE and LE are appropriately weighted, they are applied to an early clock accumulator circuit 208 where values of EE and LE are accumulated and compared to thresholds. When the number of weighted LE inputs reaches a late_thresh threshold for the early clock, or when the number of weighted EE inputs reaches an early_thresh for the early clock, an output is produced at the early clock accumulator circuit 208. This output is coupled to an early clock delay code generator circuit 212 that generates a delay code that appropriately adjusts the delay applied to the early clock signal. This code is then placed in an appropriate register of registers 216 to be read out as delay_code_early signal 142.

Late clock delay codes are generated in a similar manner. The adjustment of the late clock delay codes depends upon inputs EL and LL which are weighted by a weighting process 220, so that EL input signals are weighted more heavily than LL input signals. Once the values of EL and LL are appropriately weighted, they are applied to a late clock accumulator circuit 224 where values of EL and LL are accumulated and compared to thresholds. When the number of weighted LL inputs reaches a late_thresh threshold for the late clock, or when the number of weighted EL inputs reaches an early_thresh for the early clock, an output is produced at the late clock accumulator circuit 224. This output is coupled to a late clock delay code generator circuit 228 that generates a delay code that appropriately adjusts the delay applied to the late clock signal. This code is then placed in an appropriate register of registers 216 to be read out as delay_code_late signal 144.

The center clock delay code delay_code_center 146 is generated at 234 by finding the weighted center point between the early clock delay code and the late clock delay code and adding one half clock cycle.

Thus, in other words, a clock recovery device for recovering a clock signal from an input data signal, the clock signal having a clock cycle equal to one data bit period consistent with certain embodiments, has a circuit that identifies an earliest data transition time $T_{early}$ in an eye pattern of data signal transitions. The device also has a circuit for identifying a latest transition time $T_{late}$ in an eye pattern of data signal transitions. A calculating circuit is used to calculate an estimated optimum data sampling time as $(T_{early}+T_{late}+1$ clock cycle$)\div 2$. The clock is then adjusted for setting a sampling clock time to approximate the sampling time.

Figure 8A:
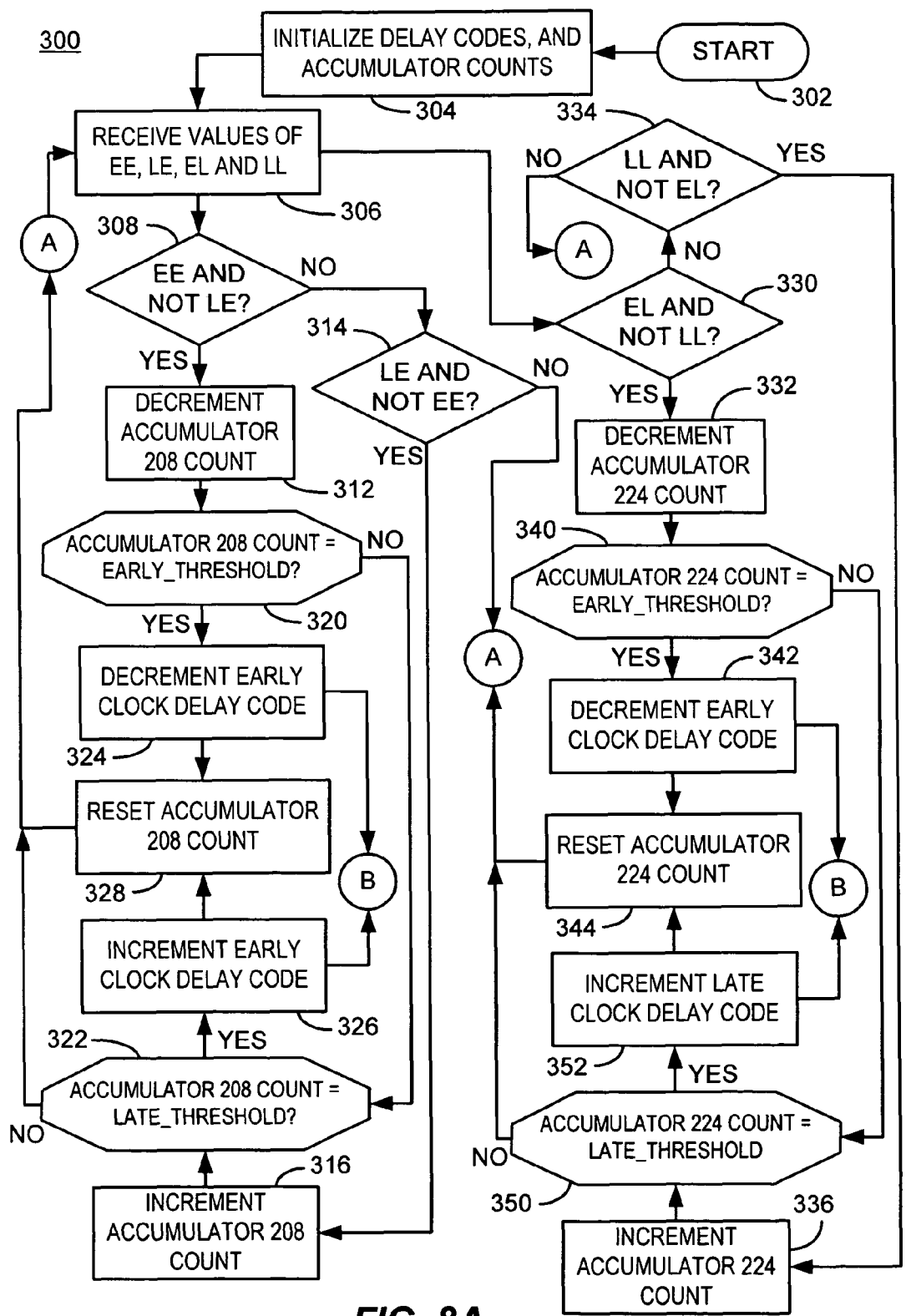
FIG. 8 (which is made up of FIG. 8A and FIG. 8B) is a flow chart describing the operation of a filtering process consistent with certain embodiments.
Figure 8B:
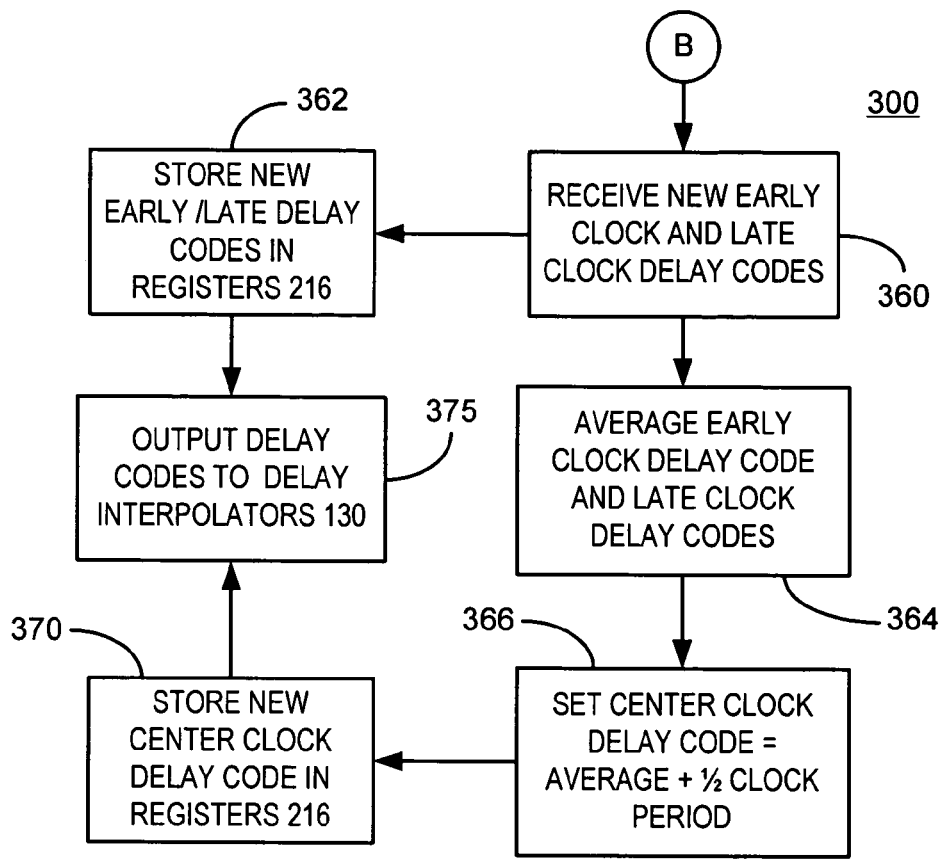

One example of an algorithm used to carry out the filtering process is depicted in FIG. 8 (which is made up of FIG. 8A and FIG. 8B). In this example, presume for now that the weighting of 204 and 220 embodied totally in the form of setting differing thresholds used by 208 and 224, however, those skilled in the art will appreciate that other weighting techniques can be used to accomplish the same results after consideration of the present teachings. Referring first to FIG. 8A, this process 300 begins at 302 and proceeds to 304 where initial values of delay codes and accumulator counts are established in an initialization process. For purposes of this example, assume that one clock cycle can be divided into 128 locations for placement of the early clock, late clock and center clock (sampling clock). By establishment of the late and early thresholds, the early clock can be biased toward the earliest clock transition in the eye pattern while the late clock can be biased toward the latest clock transition in the eye pattern. Whenever new values are received from early/late logic 120 at 306, their values are processed (preferably in parallel processing paths, but sequential is also possible) as described below.

The early thresholds and the late thresholds for the two different filters, the early clock filter and the late clock filter, can be different for the two filters so that one filter is more responsive to early samples (the filter for clock_edge_late) while the other filter is more responsive to late samples (the filter for clock_edge_early). An example set of numbers for these thresholds (without intent to impose any limitation) could be:

Reset value of accumulators for both filters—64;
  Early_threshold for clock_edge_late filter is 56;
  Late_threshold for clock_edge_late filter is 128;
  Early_threshold for clock_edge_early filter is 0; and
  Late_threshold for clock_edge_early is 72.

For this example set of numbers, the number of early votes required to move the clock_edge_late code and reset the clock_edge_late filter is 8. The number of late votes required to move the clock_edge_early code and reset the clock_edge_early filter is 8. (Difference of thresholds from reset value, taking into account whether the votes cause addition or subtraction based on FIG. 8A). Similarly, the number of late votes required to move the clock_edge_late code is 64, and the number of early votes required to move clock_edge_early is 64, in this non-limiting example. Thus, as mentioned previously, the asymmetry of the thresholds is one way to accomplish weighting of the early/late samples.

The values of EE and/of LE from logic 120 are received by decision block 308, while the values of LL and/or LE are received by decision block 310 to begin generating the early clock delay code and the late clock delay code respectively. At 308, if EE is received and not LE, the accumulator count for 208 is decremented at 312. If LE is received and not EE at 314, then the accumulator count for 208 is incremented at 316. Once incremented or decremented, the count is compared to the early_threshold at 320 and the late_threshold at 322. If the early threshold has been reached in the accumulator at 320, the early clock delay code is decremented at 324 to make the early clock earlier, and if not, control passes to 322. If the accumulator count reaches the late_threshold, the early clock delay code is incremented at 326 to make the early clock later. In either case, the process resets the accumulator 208 count at 328 to its initialized value. If neither the late_threshold nor the early_threshold is reached at 320 and 322, control returns to 306 to await receipt of the next set of values of EE and/or LE.

If values of LL and/or LE are received at 306, processing early and late clock delay codes begins at 330. If EL is present and LL is not at 330, the accumulator 224 is decremented at 332. If LL is present at 334, the accumulator 224 is incremented at 336. If the early_threshold is reached in the accumulator 224 at 340, the late clock delay code is decremented at 342 and the accumulator 224 is reset to its initialized values at 344. If, however, the accumulator 224 count is equal to the late_threshold at 350, the late clock delay code is incremented at 352 and the accumulator is reset at 344. If neither the late_threshold nor the early_threshold is reached ate 340 and then 350, control returns to 306 to await the next update of LL and/or LE values. Control similarly passes to 306 after 334.

Once the early and late clock delay codes are established, they are further processed and a center clock delay code is generated by process 300 as further depicted by FIG. 8B. When the early and late clock delay codes are generated, they are received at 360 and stored in registers 216 at 362. The early clock delay code and the late clock delay codes are averaged at 364. So, for example, if the early clock delay code is 15 (out of a possible 128) and the late clock delay code is 85 (out of a possible 128), the average is computed as (15+85)÷2=50. The center clock delay code is computed at 366 by adding ½ clock cycle to this average value. In the present example where a clock cycle is divided into 128 increments, the center clock delay code is given by adding 128 to the above total=50+128=178.

Once the center clock delay code is computed at 366, it is stored in registers 216 at 370. The early, late and center clock delay codes can then be output to the delay code interpolators at 130.

It will be clear to those skilled in the art upon consideration of this teaching, that the above operations can be done using integer arithmetic. In this example, the finest increment that the clock can be divided is 1. Thus, if the early clock delay code is incremented in process 300 to 16, the average is computed as (16+85)÷2=50 (no change since the remainder is discarded) and no change in the center is made. Thus, an incrementing of the early and late delay codes totaling two increments is required to make an adjustment to the average clock delay code and thus the center clock delay code. For example, if the early clock delay code is incremented again to 17, the average is computed as (17+85)÷2=51. Thus, the center clock is adjusted to 51+128=179.

As noted above, the threshold values set for accumulators 208 and 224 can be used to bias the placement of early and late clocks to the earliest and latest positions. This can be further adjusted, or can be alternatively adjusted, by use of weighting functions as in 204 and 220. In process 300, this manifests itself as an adjustment in the value of the incrementing or decrementing carried out at 312, 316, 332 and/or 336. Thus, for example, if EE is to be given more weight than LE, the presence of EE and not LE at 308 can be used to decrement accumulator 208 at 312 by more than the presence of LE and not EE at 314 causes the accumulator 208 to increment at 326. For example, at 312, the accumulator 208 can be decremented by 2, whereas at 316, the accumulator 208 can be incremented by only 1. Further refinement can be introduced by use of floating point math and changing the "=" criteria at 320, 322, 340 and 350 to "≧". Other variations will occur to those skilled in the art upon consideration of these teachings.

Thus, in accordance with certain embodiments, an apparatus for recovering a clock signal from an input data signal, the clock signal having a nominal clock rate with one clock cycle equal to one data bit period, has a clock generator that generates an early clock signal, a late clock signal and a center clock signal from a master clock signal operating at approximately the nominal clock rate. A first latch takes a first sample of the input data signal at a time established by the early clock signal, the early clock signal making a transition at a time estimated to be an earliest data transition time in the data bit period. A second latch takes a second sample of the input data signal at a time established by the late clock signal, the late clock signal making a transition at a time estimated to be a latest data transition time in the data bit period. A third latch takes a third sample of the input data signal at a time established by the center clock signal, the center clock signal making a transition at a time estimated to be an one half data bit period from the approximate average of the early clock signal and the late clock signal. A logic circuit generates an early vote EE when a data transition occurs before the early clock signal and generates a late vote LE when a data transition occurs later than the early clock transition, and generates an early vote EL when a data transition occurs before the late clock signal and generates a late vote LL when a data transition occurs later than the late clock transition.

A first weighted filter accumulates the early and late votes EE and LE with a heavier weighting on late votes LE than early votes EE, wherein the first weighted filter generates an early delay code based upon the accumulated value of LE and EE. A second weighted filter accumulates the early and late votes EL and LL with a heavier weighting on early votes EL than late votes LL, and wherein the second weighted filter generates late delay code based upon the accumulated value of EL and LL. A center clock calculator receives the early delay code and the late delay code and generates a center delay code therefrom.

A first delay interpolator receives the early delay code and adjusts the position of the early clock based on the early delay code. A second delay interpolator receives the late delay code and adjusts the position of the late clock based on the late delay code. A third delay interpolator that receives the center delay code and adjusts the position of the center clock based on the center delay code.

Figure 9:
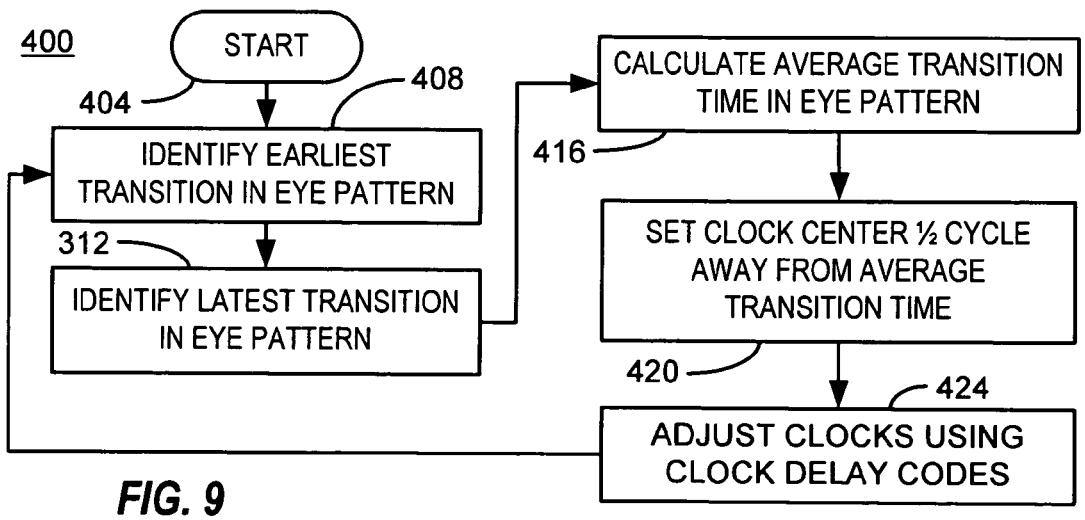
FIG. 9 is a flow chart describing the overall algorithm used in the filtering in an embodiment consistent with certain embodiments.

FIG. 9 is a flow chart 400 depicting a high level overview of the process used by circuit 100 to locate the ck_center clock signal used to determine the optimum sampling time for the input data. The process starts at 404 and the earliest transition in the eye pattern is identified at 408. The latest transition in the eye pattern is identified at 412. Conceptually, 408 and 412 can be performed in either the order shown or with 412 preceding 408, but in practice using circuit 100, these determinations are made approximately simultaneously on a continuous basis by the early/late logic 120 in combination with filter 140. An average transition time for transitions in the eye pattern is then computed at 416, and the clock center is set one half cycle away from the average transition time. At 424, the clocks 122, 124 and 126 are adjusted by use of the delay codes 142, 144 and 146 from filter 140 to the delay interpolators 130. The cycle then repeats by returning to 408, completing the feedback path.

Thus, a method of recovering a clock signal from an input data signal, the clock signal having a clock cycle equal to one data bit period, in a manner consistent with certain embodiments involves identifying an earliest transition time position in a sequence of data signal transitions; identifying a latest transition time position in the sequence of data signal transitions; calculating an approximate average transition time of the sequence of clock transitions; calculating a sampling time for sampling data in the input data signal as the approximate average transition time plus one half clock cycle; and adjusting a sampling clock time to approximate the sampling time.

The calculations described in connection with FIG. 8 are indicated to be approximate since the eye pattern is likely to be ever changing and the resolution available for clock adjustment limits the absolute accuracy of the approximation. Thus, generally speaking, the term "approximately" is generally used to mean within the accuracy of adjustability of the clock. For example, if the resolution of the clock adjustment limited to $1/128^{th}$ of the clock cycle, an adjustment to within about two or three $1/128^{th}$ of the clock cycle will generally be considered to be close enough to the desired position of the clock transition, allowing for rounding the clock position during calculations, integer arithmetic, actual jitter encountered, and depending upon the application and desired degree of protection against asymmetric jitter.

While certain embodiments herein were described in conjunction with specific circuitry that carries out the functions described, other embodiments are contemplated in which the circuit functions are carried out using equivalent software or firmware embodiments executed on one or more programmed processors. General purpose computers, microprocessor based computers, micro-controllers, optical computers, analog computers, dedicated processors, application specific circuits and/or dedicated hard wired logic and analog circuitry may be used to construct alternative equivalent embodiments. Software and/or firmware embodiments may be implemented using a programmed processor executing programming instructions that in certain instances are broadly described above in flow chart form that can be stored on any suitable electronic or computer readable storage medium (such as, for example, disc storage, Read Only Memory (ROM) devices, Random Access Memory (RAM) devices, network memory devices, optical storage elements, magnetic storage elements, magneto-optical storage elements, flash memory, core memory and/or other equivalent volatile and non-volatile storage technologies) and/or can be transmitted over any suitable electronic communication medium. However, those skilled in the art will appreciate, upon consideration of the present teaching, that the processes described above can be implemented in any number of variations and in many suitable programming languages without departing from embodiments of the present invention. For example, the order of certain operations carried out can often be varied, additional operations can be added or operations can be deleted without departing from certain embodiments of the invention. Error trapping can be added and/or enhanced and variations can be made in user interface and information presentation without departing from certain embodiments of the present invention. Such variations are contemplated and considered equivalent.

While certain illustrative embodiments have been described, it is evident that many alternatives, modifications, permutations and variations will become apparent to those skilled in the art in light of the foregoing description.

What is claimed is:

1. A method of recovering a clock signal from an input data signal, the clock signal having a clock cycle equal to one data bit period, comprising:
   identifying an earliest transition time position in a sequence of data signal transitions forming an eye pattern opening;
   identifying a latest transition time position in the sequence of data signal transitions forming the eye pattern opening;
   calculating an approximate average transition time position of the sequence of clock transitions forming the eye pattern opening based on the earliest transition time position and the latest transition time position;
   establishing a time in the sequence of data signal transitions forming the eye pattern opening representing the earliest transition time in the eye pattern opening;
   establishing a time in the sequence of data signal transitions forming the eye pattern opening representing the latest transition time in the eye pattern opening;
   finding a time half way between the earliest transition time and the latest transition time forming the eye pattern opening as the approximate average transition time;
   calculating a sampling time for sampling data in the input data signal as the approximate average transition time position plus one half clock cycle; and
   adjusting a sampling clock time to approximate the sampling time.

2. The method according to claim 1, wherein the adjusting comprises generating a clock adjustment signal that adjusts a sampling clock's delay with respect to a reference clock.

3. The method according to claim 1, wherein identifying the earliest transition time position comprises:

receiving a code indicating that an early data transition in the sequence of data signal transitions forming the eye pattern opening is earlier or later than a most recently established early transition time;

accumulating a value of earlier and later transitions, with later transitions being weighted more heavily than early transitions to produce an early transition accumulated value;

generating a clock adjustment signal that adjusts the earliest transition time to an earlier position when the early transition accumulated value exceeds a first threshold; and generating a clock adjustment signal that adjusts the earliest transition time to a later position when the early transition accumulated value exceeds a second threshold.

4. The method according to claim 1, wherein identifying the latest transition time position comprises:

receiving a code indicating that a late data transition in the sequence of data signal transitions forming the eye pattern opening is earlier or later than a most recently established late transition time;

accumulating a value of earlier and later transitions, with early transitions being weighted more heavily than late transitions to produce a late transition accumulated value;

generating a clock adjustment signal that adjusts the latest transition time to an earlier position when the late transition accumulated value exceeds a first threshold; and generating a clock adjustment signal that adjusts the latest transition time to a later position when the late transition accumulated value exceeds a second threshold.

5. An apparatus for recovering a clock signal from an input data signal, the clock signal having a nominal clock rate with one clock cycle equal to one data bit period, the apparatus comprising:

a clock generator that generates an early clock signal, a late clock signal and a center clock signal from a master clock signal operating at approximately the nominal clock rate;

a first latch that takes a first sample of the input data signal at a time established by the early clock signal, said early clock signal making a transition at a time estimated to be an earliest data transition time in the data bit period;

a second latch that takes a second sample of the input data signal at a time established by the late clock signal, said late clock signal making a transition at a time estimated to be a latest data transition time in the data bit period;

a third latch that takes a third sample of the input data signal at a time established by the center clock signal, said center clock signal making a transition at a time estimated to be an one half data bit period from the approximate average of the early clock signal and the late clock signal;

a logic circuit that generates a first type early vote ("EE") when a data transition occurs before the early clock signal and generates a first type late vote ("LE") when a data transition occurs later than the early clock transition;

the logic circuit further generates a second type early vote ("EL") when a data transition occurs before the late clock signal and generates a second type late vote ("LL") when a data transition occurs later than the late clock transition;

a filter comprising:

a first weighted filter that accumulates the EE and LE votes with a heavier weighting on LE votes than EE votes, and wherein the first weighted filter generates an early delay code based upon the accumulated value of LE votes and EE votes;

a second weighted filter that accumulates the EL and LL votes with a heavier weighting on EL votes than LL votes, and wherein the second weighted filter generates late delay code based upon the accumulated value of EL votes and LL votes;

a center clock calculator that receives the early delay code and the late delay code and generates a center delay code therefrom;

a first delay interpolator that receives the early delay code and adjusts the position of the early clock based on the early delay code;

a second delay interpolator that receives the late delay code and adjusts the position of the late clock based on the late delay code; and a third delay interpolator that receives the center delay code and adjusts the position of the center clock based on the center delay code.

6. An apparatus for recovering a clock signal from an input data signal, the clock signal having a nominal clock rate with one clock cycle equal to one data bit period, the apparatus comprising:

a clock generator that generates an early clock signal, a late clock signal and a center clock signal from a master clock signal operating at approximately the nominal clock rate;

a first latch that takes a first sample of the input data signal at a time established by the early clock signal, said early clock signal making a transition at a time estimated to be an earliest data transition time in the data bit period;

a second latch that takes a second sample of the input data signal at a time established by the late clock signal, said late clock signal making a transition at a time estimated to be a latest data transition time in the data bit period;

a third latch that takes a third sample of the input data signal at a time established by the center clock signal, said center clock signal making a transition at a time estimated to be an one half data bit period from the approximate average of the early clock signal and the late clock signal;

a logic circuit that generates a first type early vote ("EE") when a data transition occurs before the early clock signal and generates a first type late vote ("LE") when a data transition occurs later than the early clock transition;

the logic circuit further generates a second type early vote ("EL") when a data transition occurs before the late clock signal and generates a second type late vote ("LL") when a data transition occurs later than the late clock transition; and a filter that processes the EE, LE, EL and LL votes to establish an early clock delay code, a late clock delay code and a center clock delay code, wherein the early clock code establishes the time of the early clock signal, the late clock delay code establishes the time of the late clock signal and the center clock signal establishes the time of the center clock signal.

7. The apparatus of claim 6, wherein the filter comprises a first weighted filter that accumulates the EE and LE votes with a heavier weighting on LE votes than EE votes, and wherein the first weighted filter generates an early delay code based upon the accumulated value of LE votes and EE votes.

8. The apparatus of claim 7, wherein the filter further comprises a second weighted filter that accumulates the EL and LL votes with a heavier weighting on EL votes than LL votes, and wherein the second weighted filter generates late delay code based upon the accumulated value of EL votes and LL votes.

9. The apparatus of claim 7, wherein the first weighted filter comprises a first accumulator that generates an output that increments or decrements the early delay code when a late threshold or an early threshold is reached respectively.

10. The apparatus of claim 8, wherein the second weighted filter comprises a second accumulator that generates an output that increments or decrements the late delay code when an early or a late threshold is reached respectively.

11. The apparatus of claim 9, wherein the first weighted filter is weighted by establishing differing early and late threshold values for decrementing and incrementing the accumulated values.

12. The apparatus of claim 10, wherein the second weighted filter is weighted by establishing differing early and late threshold values for incrementing and decrementing the accumulated values.

13. The apparatus of claim 10, wherein at least one of the first and second weighted filters is weighted by accumulating weighted values in their respective accumulators.

14. The apparatus of claim 8, wherein the filter further comprises a center clock calculator that receives the early delay code and the late delay code and generates a center delay code therefrom.

15. The apparatus of claim 14, wherein the center delay code is generated by adding one half of a clock cycle to an average of the early delay code and the late delay code.

16. The apparatus of claim 6, further comprising delay interpreting means for adjusting the position of the early clock, the late clock and the center clock based upon the early delay code, the late delay code and the center delay code.

17. The apparatus of claim 6, further comprising:
a first delay interpolator that receives the early delay code and adjusts the position of the early clock based on the early delay code;
a second delay interpolator that receives the late delay code and adjusts the position of the late clock based on the late delay code; and
a third delay interpolator that receives the center delay code and adjusts the position of the center clock based on the center delay code.

18. A clock recovery device for recovering a clock signal from an input data signal, the clock signal having a clock cycle equal to one data bit period, comprising:
means for identifying an earliest data transition time $T_{early}$ in an eye pattern opening formed by data signal transitions;
means for identifying a latest transition time $T_{late}$ in the eye pattern opening formed by data signal transitions;
means for establishing a time in a sequence of data signal transitions forming the eye pattern opening representing $T_{early}$ in the eye pattern opening;
means for establishing a time in the sequence of data signal transitions forming the eye pattern opening representing $T_{late}$ in the eye pattern opening;
means for finding a time half way between $T_{early}$ and $T_{late}$ as an approximate average transition time;
calculating means that calculates an estimated optimum data sampling time as ($T_{early}$+$T_{late}$+1 clock cycle)÷2; and
clock adjusting means for setting a sampling clock time to approximate the sampling time.

19. The device according to claim 18, wherein the clock adjusting means generates a clock adjustment signal that adjusts a sampling clock's delay with respect to a reference clock.

20. The device according to claim 18, wherein the earliest transition time is identified by:
receiving a code indicating that an early data transition in the sequence of data signal transitions forming the eye pattern opening is earlier or later than a most recently established early transition time;
accumulating a value of earlier and later transitions to produce an early transition accumulated value;
generating a clock adjustment signal that adjusts the earliest transition time to an earlier position when the early transition accumulated value exceeds a first threshold; and
generating a clock adjustment signal that adjusts the earliest transition time to a later position when the early transition accumulated value exceeds a second threshold.

21. The device according to claim 20, wherein the first and second thresholds are not equal.

22. The device according to claim 20, wherein late transitions are weighted more heavily than early transitions.

23. The device according to claim 18, wherein the latest transition time is identified by:
receiving a code indicating that a late data transition in the sequence of data signal transitions forming the eye pattern opening is earlier or later than a most recently established late transition time;
accumulating a value of earlier and later transitions to produce a late transition accumulated value;
generating a clock adjustment signal that adjusts the latest transition time to an earlier position when the late transition accumulated value exceeds a first threshold; and
generating a clock adjustment signal that adjusts the latest transition time to a later position when the late transition accumulated value exceeds a second threshold.

24. The device according to claim 23, wherein the first and second thresholds are not equal.

25. The device according to claim 23, wherein early transitions are weighted more heavily than late transitions.

* * * * *

UNITED STATES PATENT AND TRADEMARK OFFICE
CERTIFICATE OF CORRECTION

| | | |
|---|---|---|
| PATENT NO. | : 7,873,132 B2 | Page 1 of 1 |
| APPLICATION NO. | : 11/232154 | |
| DATED | : January 18, 2011 | |
| INVENTOR(S) | : Jayen Desai | |

It is certified that error appears in the above-identified patent and that said Letters Patent is hereby corrected as shown below:

In column 11, line 52, in Claim 5, after "be" delete "an".

In column 12, line 40, in Claim 6, after "be" delete "an".

In column 14, line 7, in Claim 18, delete "cycle)+2;" and insert -- cycle)÷2; --, therefor.

Signed and Sealed this
Nineteenth Day of April, 2011

David J. Kappos
*Director of the United States Patent and Trademark Office*